US012784867B2

(12) United States Patent
Huang

(10) Patent No.: US 12,784,867 B2
(45) Date of Patent: Nov. 3, 2026

(54) MEMORY DEVICE AND CONTROL METHOD THEREFOR

(71) Applicant: CXMT CORPORATION, Hefei (CN)

(72) Inventor: Zequn Huang, Hefei (CN)

(73) Assignee: CXMT Corporation, Hefei (CN)

( * ) Notice: Subject to any disclaimer, the term of this patent is extended or adjusted under 35 U.S.C. 154(b) by 28 days.

(21) Appl. No.: 18/822,476

(22) Filed: Sep. 3, 2024

(65) Prior Publication Data

US 2024/0428878 A1 Dec. 26, 2024

Related U.S. Application Data

(63) Continuation of application No. PCT/CN2023/070381, filed on Jan. 4, 2023.

(30) Foreign Application Priority Data

Oct. 19, 2022 (CN) ......................... 202211291699.2

(51) Int. Cl.

| | |
|---|---|
| ***G11C 29/00*** | (2006.01) |
| ***G11C 7/10*** | (2006.01) |
| ***G11C 7/22*** | (2006.01) |

(52) U.S. Cl.

CPC .......... *G11C 29/789* (2013.01); *G11C 7/1036* (2013.01); *G11C 7/222* (2013.01)

(58) Field of Classification Search

None

See application file for complete search history.

(56) References Cited

U.S. PATENT DOCUMENTS

| | | | | |
|---|---|---|---|---|
| 10,388,362 | B1 * | 8/2019 | Hadrick | G11C 29/42 |
| 2015/0310935 | A1 | 10/2015 | Ku | |

FOREIGN PATENT DOCUMENTS

| | | | | |
|---|---|---|---|---|
| CN | 101639819 | A * | 2/2010 | |
| CN | 104268030 | A | 1/2015 | |
| CN | 113535524 | A | 10/2021 | |
| TW | 200937202 | A * | 9/2009 | G11C 16/0483 |
| TW | 201403602 | A | 1/2014 | |

OTHER PUBLICATIONS

ISA State Intellectual Property Office of the People's Republic of China, International Search Report and written opinion Issued in Application No. PCT/CN2023/070381, Jun. 29, 2023, WIPO, 9 pages.

* cited by examiner

*Primary Examiner* — Guerrier Merant

(74) *Attorney, Agent, or Firm* — Intellectual Valley Law, P.C.

(57) ABSTRACT

Provided are a memory device, including a cyclic redundancy check (CRC) circuit, configured to indicate whether a CRC error has been detected from data transmission between a host device and the memory device. The cyclic redundancy check (CRC) circuit includes: a detection module, configured to generate a CRC signal to correspondingly indicate that N CRC errors have been detected from the data transmission between the host device and the memory device, where the CRC signal has N pulses corresponding to the N CRC errors, and N is an integer greater than 1; and an alert signal generation unit, configured to generate an alert signal when a time interval between any two adjacent pulses in the CRC signal is less than or equal to a first preset time interval, where the alert signal has two pulses corresponding to the two adjacent pulses in the CRC signal.

20 Claims, 5 Drawing Sheets

| | CRC_0 | CRC_1 | CRC_RST | ALERT_Pre | ALERT_n |
|---|---|---|---|---|---|
| T1 | 1 | 0 | 0 | 0 | 1 |
| T2 | 0 | 1 | 0 | 1 | 0 |
| T3 | 0 | 0 | 0 | 1 | 0 |
| T4 | 1 | 0 | 0 | 1 | 1 |
| T5 | 0 | 1 | 0 | 1 | 0 |
| T6 | 0 | 0 | 0 | 1 | 0 |
| T7 | 0 | 0 | 1 | 0 | 1 |

MEMORY DEVICE AND CONTROL METHOD THEREFOR

CROSS-REFERENCE TO RELATED APPLICATIONS

The present disclosure is a continuation of PCT/CN2023/070381, filed on Jan. 4, 2023, which claims priority to the Chinese Patent Application No. 202211291699.2, filed on Oct. 19, 2022, and entitled "MEMORY DEVICE AND CONTROL METHOD THEREFOR", and claims priority to the Chinese Patent Application, which are incorporated herein by reference in their entireties.

TECHNICAL FIELD

The present disclosure relates to the field of semiconductor technologies, and relates to but is not limited to a memory device and a control method therefor.

BACKGROUND

In a data transmission process of a memory device and a host device, errors are inevitable regardless of how perfect a transmission system design is. As a result, incorrect data may be received by a receiver. To ensure the reliability of data transmission, the receiver needs to perform error detection on data before receiving the data. Cyclic redundancy check (CRC) is an important way to perform error detection in the data transmission process.

However, with the continuous development of semiconductor technologies, a new requirement is put forward for a cyclic redundancy check (CRC) circuit.

SUMMARY

In view of this, the main objective of the present disclosure is to provide a memory device and a control method therefor.

To achieve the foregoing objective, the technical solutions of the present disclosure are implemented as follows:

An embodiment of the present disclosure provides a memory device, including:

a cyclic redundancy check (CRC) circuit, configured to indicate whether a CRC error has been detected from data transmission between a host device and the memory device, where the cyclic redundancy check (CRC) circuit includes:

a detection module, configured to generate a CRC signal to correspondingly indicate that N CRC errors have been detected from the data transmission between the host device and the memory device, where the CRC signal has N pulses corresponding to the N CRC errors, and N is an integer greater than 1; and an alert signal generation module, configured to generate an alert signal when a time interval between any two adjacent pulses in the CRC signal is less than or equal to a first preset time interval, where the alert signal has two pulses corresponding to the two adjacent pulses in the CRC signal.

In the foregoing solution, the alert signal generation module includes a first delay unit, a second delay unit, and an alert signal generation unit. The first delay unit is configured to perform a delay operation on the CRC signal, and generate a first delayed signal. The second delay unit is configured to perform a delay operation on the first delayed signal, and generate a second delayed signal and a third delayed signal. The third delayed signal is delayed by a second preset time interval relative to the second delayed signal. The alert signal generation unit is configured to generate the alert signal based on the first delayed signal, the second delayed signal, and the third delayed signal. The alert signal includes at least one pulse with the width of the second preset time interval.

In the foregoing solution, the second delay unit is a shift register, the length value of the shift register is M, and M is an integer greater than or equal to (T+1).

In the foregoing solution, the shift register includes M-stage flip-flops. The same clock signal is received by clock terminals of M flip-flops constituting the M-stage flip-flops, and an output port Q of each current-stage flip-flop in the M-stage flip-flops is connected to an input port D of a next-stage flip-flop. The first delayed signal is received by an input port D of a first-stage flip-flop, and an output port Q of the first-stage flip-flop is connected to a first input terminal of the alert signal generation unit, and outputs the second delayed signal delayed by one clock cycle to the alert signal generation unit. An output port Q of an $M^{th}$-stage flip-flop is connected to a second input terminal of the alert signal generation unit, and outputs the third delayed signal delayed by M clock cycles to the alert signal generation unit.

In the foregoing solution, the CRC signal serves as a reset signal for the M flip-flops of the shift register.

In the foregoing solution, the alert signal generation unit includes a latch unit and a logical operation unit.

The latch unit is configured to receive the second delayed signal and the third delayed signal, and output a pre-alert signal; and the logical operation unit is configured to receive the pre-alert signal and the first delayed signal, and output the alert signal.

In the foregoing solution, the latch unit includes an SR latch, and a set port of the SR latch serves as the first input terminal of the alert signal generation unit, and is connected to the output port Q of the first-stage flip-flop; and a reset port of the SR latch serves as the second input terminal of the alert signal generation unit, and is connected to the output port Q of the $M^{th}$-stage flip-flop, and an output terminal of the SR latch is connected to an input terminal of the logical operation unit.

In the foregoing solution, the logical operation unit includes an inverter and a logic NAND gate, and an input terminal of the inverter is connected to an output port of the first delay unit, and is configured to receive the first delayed signal; and output terminals of the SR latch and the inverter are connected to an input terminal of the logic NAND gate, and the logic NAND gate receives the pre-alert signal and the first delayed signal subjected to a logical NOT operation, and outputs the alert signal.

In the foregoing solution, the second delayed signal is delayed by at least one clock cycle relative to the first delayed signal. In the foregoing solution, the first preset time interval is T clock cycles, and T is an integer greater than or equal to 1 and less than or equal to 12.

In the foregoing solution, the length of the second preset time interval is greater than or equal to T clock cycles.

In the foregoing solution, the sum of a delay applied by the first delay unit to the CRC signal and one clock cycle is less than 13 ns. An embodiment of the present disclosure further provides a control method for a memory device, including the steps as follows:

A CRC error is detected from data transmission between a host device and the memory device.

A corresponding CRC signal is generated based on the CRC error, to correspondingly indicate that N CRC errors have been detected from the data transmission between the host device and the memory device. The CRC signal has N pulses corresponding to the N CRC errors, and N is an integer greater than 1.

An alert signal is generated when a time interval between any two adjacent pulses in the CRC signal is less than or equal to a first preset time interval. The alert signal has two pulses corresponding to the two adjacent pulses in the CRC signal.

In the foregoing solution, the method further includes the steps as follows: A delay operation is performed on the CRC signal, and a first delayed signal is generated. A delay operation is performed on the first delayed signal, and a second delayed signal and a third delayed signal are generated. The third delayed signal is delayed by a second preset time interval relative to the second delayed signal. The alert signal is generated based on the first delayed signal, the second delayed signal, and the third delayed signal. The alert signal includes at least one pulse with the width of the second preset time interval.

In the foregoing solution, the second delayed signal is delayed by at least one clock cycle relative to the first delayed signal.

In the foregoing solution, the first preset time interval is T clock cycles, and T is an integer greater than or equal to 1 and less than or equal to 12.

In the foregoing solution, the length of the second preset time interval is greater than or equal to T clock cycles.

In the foregoing solution, the third delayed signal is delayed by M clock cycles relative to the first delayed signal, and M is an integer greater than or equal to (T+1).

In the technical solutions provided in the embodiments of the present disclosure, a cyclic redundancy check (CRC) circuit in a memory device is redesigned, and a cyclic redundancy check (CRC) circuit is provided. The cyclic redundancy check (CRC) circuit is provided with a detection module, configured to generate a CRC signal to correspondingly indicate that N CRC errors have been detected from data transmission between a host device and the memory device, where the CRC signal has N pulses corresponding to the N CRC errors, and N is an integer greater than 1; and an alert signal generation module, configured to generate an alert signal when a time interval between any two adjacent pulses in the CRC signal is less than or equal to a first preset time interval, where the alert signal has two pulses corresponding to the two adjacent pulses in the CRC signal. As such, during error detection performed by the cyclic redundancy check (CRC) circuit in the memory device provided in the present disclosure, when N CRC errors occurring in a data transmission process are detected, an alert signal having N pulses corresponding to the N CRC errors can be generated, and the CRC errors can be identified with the alert signal, so that the reliability of the data transmission process is improved.

DESCRIPTION OF EMBODIMENTS

Figure 1:
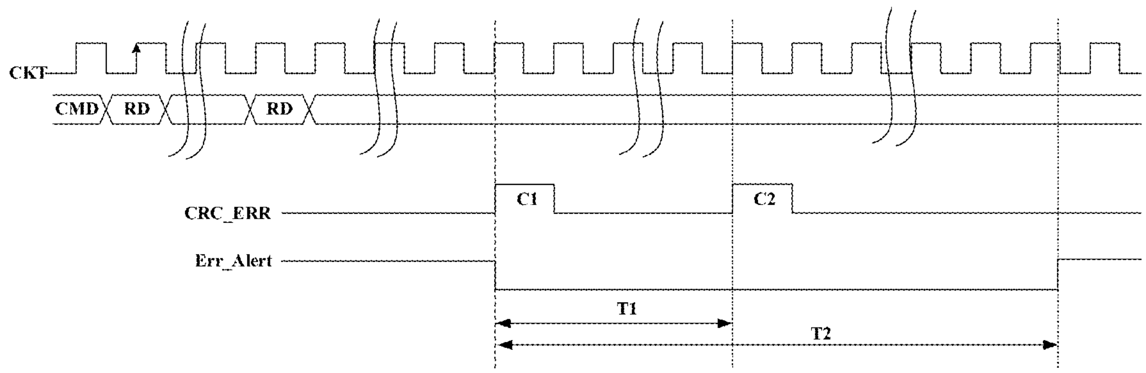
FIG. 1 is a timing diagram of generating an alert signal by a cyclic redundancy check (CRC) circuit according to an example embodiment.

The technical solutions of the present disclosure are further described below in detail with reference to the accompanying drawings and the embodiments. Although example implementations of the present disclosure are shown in the accompanying drawings, it should be understood that the present disclosure may be implemented in various forms without being limited by the implementations described herein. Instead, these implementations are provided to develop a more thorough understanding of the present disclosure and to fully convey the scope of the present disclosure to a person skilled in the art.

In the following paragraphs, the present disclosure is described more specifically by way of example with reference to the accompanying drawings. The advantages and features of the present disclosure will be clearer from the following description and claims. It should be noted that the accompanying drawings are presented in a highly simplified form and are not to exact scale, and are merely intended to conveniently and clearly assist in describing the embodiments of the present disclosure.

It should be understood that the spatial relationship terms "below", "above", and the like may be utilized herein for convenience of description, to describe the relationship between one element or feature and another element or feature shown in the figures. It should be understood that in addition to the orientations shown in the figures, the spatial relationship terms are further intended to include different orientations of components in use and operation. For example, if the component in the accompanying drawings is flipped, an element or a feature described as "below another element" is oriented to be "above" the another element or feature. Therefore, the example term "below" may include orientations of being above and being below. The component may be otherwise oriented (rotated by 90 degrees or oriented in another manner), and the spatial descriptors utilized herein are interpreted accordingly.

The terms utilized herein are intended merely to describe specific embodiments and are not construed as a limitation on the present disclosure. As utilized herein, the singular forms "a/an", "one", and "the" are also intended to include plural forms unless the context clearly indicates otherwise. It should also be understood that the terms "constitute" and/or "include" are utilized in the specification to determine the presence of the feature, integer, step, operation, element, and/or component, but not rule out the presence or addition of one or more other features, integers, steps, operations, elements, components, and/or groups. As utilized herein, the term "and/or" includes any and all combinations of the related items listed.

It should be noted that the technical solutions described in the embodiments of the present disclosure may be randomly combined when there is no conflict.

In a data transmission process (e.g., a write operation process), a cyclic redundancy check (CRC) circuit receives a data signal and a redundancy code for error detection from a data transmit end, and detects, with the data signal and the redundancy code, whether a CRC error has occurred in the data transmission process. When a CRC error occurs in the data transmission process, a CRC alert signal Err_Alert corresponding to the CRC error is output by the cyclic redundancy check (CRC) circuit, to indicate that the CRC error has been detected, so as to re-perform the foregoing data transmission operation.

In some specifications (e.g., the double-data-rate fifth generation synchronous dynamic random access memory (DDR5 SDRAM) specification), a low-logic-level pulse with a pulse width of 12 to 20 clock cycles needs to be output by the CRC alert signal Err_Alert when a CRC error is detected from the data transmission process. Multiple low-logic-level pulses need to be correspondingly output by the CRC alert signal Err_Alert when multiple consecutive CRC errors are detected from the data transmission process. However, two pulses of a generated CRC alert signal Err_Alert overlap each other and become a large pulse when CRC errors occur in two consecutive data transmission processes (e.g., read operation processes) and the quantity of clock cycles between the two CRC errors is less than or equal to 12.

FIG. 1 is a timing diagram of generating an alert signal by a cyclic redundancy check (CRC) circuit according to an example embodiment. As shown in FIG. 1, CRC errors are detected from two consecutive read operation processes, a signal CRC_ERR which is a response to the two CRC errors has two pulses C1 and C2, and there are T1 clock cycles between two adjacent pulses, where T1 is an integer less than or equal to 12. Because T1 is less than or equal to 12, to be specific, T1 is less than or equal to a minimum value of a pulse width of a CRC alert signal Err_Alert required by the DDR5 specification, the first pulse, corresponding to C1, of an output CRC alert signal Err_Alert is covered by the second pulse corresponding to C2, and finally, the CRC alert signal Err_Alert has only one pulse with a pulse width of T2. Therefore, multiple CRC errors cannot be identified with the CRC alert signal Err_Alert. As a result, some CRC errors may be skipped, greatly reducing the reliability of error detection.

Therefore, the following implementations are provided in the present disclosure.

Figure 2:
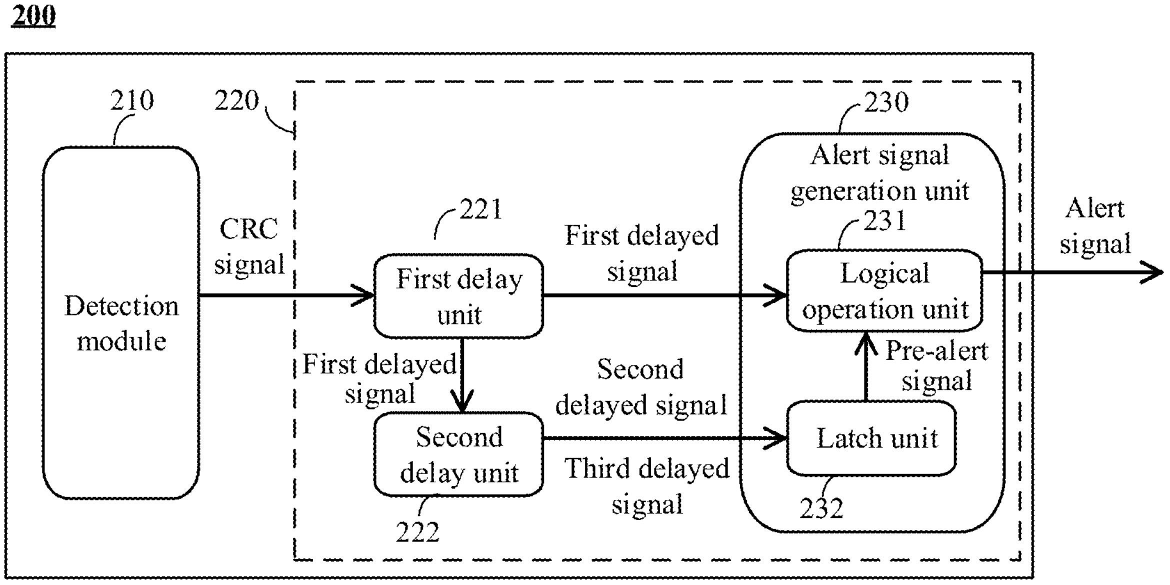
FIG. 2 is a block diagram of a cyclic redundancy check (CRC) circuit according to an embodiment of the present disclosure.

A memory device provided in the embodiments of the present disclosure includes a cyclic redundancy check (CRC) circuit, configured to indicate whether a CRC error has been detected from data transmission between a host device and the memory device. FIG. 2 is a block diagram of a cyclic redundancy check (CRC) circuit 200 according to an embodiment of the present disclosure. The cyclic redundancy check (CRC) circuit 200 includes: a detection module 210, configured to generate a CRC signal to correspondingly indicate that N CRC errors have been detected from data transmission between a host device and a memory device, where the CRC signal has N pulses corresponding to the N CRC errors, and Nis an integer greater than 1; and an alert signal generation module 220, configured to generate an alert signal when a time interval between any two adjacent pulses in the CRC signal is less than or equal to a first preset time interval, where the alert signal has two pulses corresponding to the two adjacent pulses in the CRC signal.

In some embodiments, a process of performing a write operation on the memory device is described as an example, and a data signal and a redundancy code for error detection are received at the detection module 210 by the cyclic redundancy check circuit 200 from a data transmit end (e.g., the host device). Whether a CRC error has occurred may be detected by the detection module 210 with the data signal and the redundancy code in the data transmission process. A CRC signal CRC_ERR is output by the detection module 210 when a CRC error occurs in the data transmission process, to indicate that the CRC error has been detected.

In this embodiment of the present disclosure, the alert signal generation module 230 includes a first delay unit 221, a second delay unit 222, and an alert signal generation unit 230. The first delay unit 221 is configured to perform a delay operation on the CRC signal, and generate a first delayed signal. The second delay unit 222 is configured to perform a delay operation on the first delayed signal, and generate a second delayed signal and a third delayed signal. The third delayed signal is delayed by a second preset time interval relative to the second delayed signal. The alert signal generation unit 230 is configured to generate the alert signal based on the first delayed signal, the second delayed signal, and the third delayed signal. The alert signal includes at least one pulse with the width of the second preset time interval.

Figure 3:
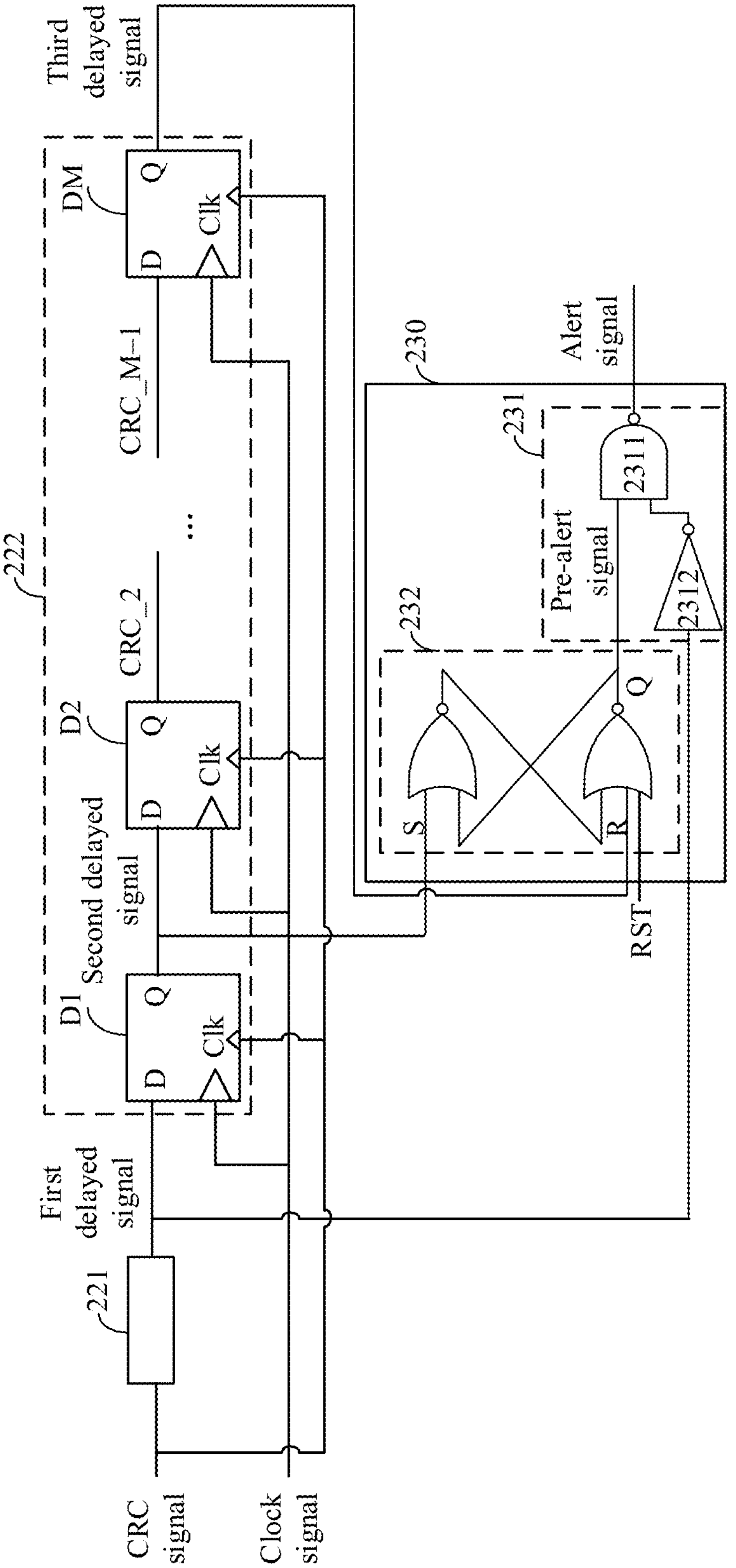
FIG. 3 is a partial schematic diagram of a cyclic redundancy check (CRC) circuit according to an embodiment of the present disclosure.

In some embodiments, as shown in FIG. 3, a CRC signal CRC_ERR is received by an input port of the first delay unit 221, and an output port of the first delay unit 221 is connected to an input port of the second delay unit 222, and outputs a first delayed signal CRC_0 to the second delay unit 222 after a delay operation is performed by the first delay unit 221 on the CRC signal CRC_ERR. In some examples, the first delay unit may be implemented by a delay circuit.

In some embodiments, the sum of a delay applied by the first delay unit to the CRC signal and one clock cycle is less than 13 ns.

In this embodiment of the present disclosure, the second delay unit 222 is a shift register, the length value of the shift register is M, and M is an integer greater than or equal to (T+1).

In some embodiments, the shift register includes M-stage flip-flops. The same clock signal is received by clock terminals of M flip-flops constituting the M-stage flip-flops, and an output port Q of each current-stage flip-flop in the M-stage flip-flops is connected to an input port D of a next-stage flip-flop. The first delayed signal is received by an input port D of a first-stage flip-flop, and an output port Q of the first-stage flip-flop is connected to a first input terminal of the alert signal generation unit, and outputs the second delayed signal delayed by one clock cycle to the alert signal generation unit. An output port Q of an $M^{th}$-stage flip-flop is connected to a second input terminal of the alert signal generation unit, and outputs the third delayed signal delayed by M clock cycles to the alert signal generation unit.

In some embodiments, the second delayed signal is delayed by at least one clock cycle relative to the first delayed signal.

In some embodiments, the M-stage flip-flops may include M flip-flops, and each flip-flop includes four ports: a clock terminal Clk, an input port D, an output port Q, and a reset port. Output ports Q of the M flip-flops are connected to input ports D thereof stage by stage. Specifically, referring to FIG. 3, a first delayed signal CRC_0 is received by an input port D of a first-stage flip-flop D1, a clock signal is received by a clock terminal Clk of the first-stage flip-flop D1, and an output port Q of the first-stage flip-flop D1 is connected to the first input terminal of the alert signal generation unit. A second delayed signal CRC_1 delayed by one clock cycle is transmitted by the output port Q of the first-stage flip-flop D1 to an input port D of the second-stage flip-flop D2 and the first input terminal of the alert signal generation unit after a delay operation is performed by the first-stage flip-flop D1 on the first delayed signal CRC_0. The same clock signal is received by a clock terminal Clk of the second-stage flip-flop D2, and a delayed signal CRC_2 delayed by two clock cycles is transmitted by an output port Q of the second-stage flip-flop D2 to an input port D of a next-stage flip-flop. By analogy, a delayed signal CRC_M−1 delayed by (M−1) clock cycles is transmitted by an output port Q of an $(M-1)^{th}$ flip-flop DM−1 to an input port D of an $M^{th}$-stage flip-flop DM, the same clock signal is received by a clock terminal Clk of the $M^{th}$-stage flip-flop DM, and an output port Q of the $M^{th}$-stage flip-flop is connected to the second input terminal of the alert signal generation unit, and outputs a third delayed signal CRC_RST delayed by M clock cycles to the second input terminal of the alert signal generation unit.

In some embodiments, the flip-flop in the second delay unit may be a D flip-flop.

In this embodiment of the present disclosure, as shown in FIG. 3, the CRC signal CRC_ERR serves as a reset signal for the M flip-flops of the shift register. In some embodiments, the first preset time interval is T clock cycles, and T is an integer greater than or equal to 1 and less than or equal to 12. An interval between two adjacent pulses of the CRC signal CRC_ERR is the first preset time interval. A reset operation is performed on the second delay unit 222 each time an $N^{th}$ pulse of the second delayed signal CRC_1 transitions from a first signal value to a second signal value. Because a preliminary delay operation is performed by the first delay unit 221 on the CRC signal CRC_ERR, signal glitches can be reduced when the reset operation is performed on the second delay unit 222 based on the CRC signal CRC_ERR. The first signal value is at a low logic level, and the second signal value is at a high logic level.

In some embodiments, M is an integer greater than or equal to (T+1). In a specific example, the second delay unit 222 includes 13-stage flip-flops when M is equal to 13. Therefore, an interval between the second delayed signal CRC_1 and the first delayed signal CRC_0 is one clock cycle, and an interval between the third delayed signal CRC_RST and the first delayed signal CRC_0 is 13 clock cycles.

In this embodiment of the present disclosure, the alert signal generation unit 230 includes a latch unit 232 and a logical operation unit 231. The latch unit 232 is configured to receive the second delayed signal CRC_1 and the third delayed signal CRCR_RST, and output a pre-alert signal ALERT_Pre. The logical operation unit 231 is configured to receive the pre-alert signal ALERT_Pre and the first delayed signal CRC_0, and output the alert signal ALERT_n.

In some embodiments, as shown in FIG. 3, the latch unit 232 includes an SR latch, and a set port S of the SR latch serves as the first input terminal of the alert signal generation unit 230, and is connected to the output port Q of the first-stage flip-flop D1. A reset port R of the SR latch serves as the second input terminal of the alert signal generation unit 230, and is connected to the output port Q of the $M^{th}$-stage flip-flop DM, and an output terminal of the SR latch is connected to an input terminal of the logical operation unit 231.

In some embodiments, as shown in FIG. 3, the reset port of the SR latch in the latch unit 232 is further configured to receive a reset signal RST, and the reset signal RST is always at a low logic level.

In this embodiment of the present disclosure, the logical operation unit 231 includes an inverter 2312 and a logic NAND gate 2311, and an input terminal of the inverter 2312 is connected to the output port of the first delay unit 221, and is configured to receive the first delayed signal CRC_0. Output terminals of the SR latch and the inverter 2312 are connected to an input terminal of the logic NAND gate 2311, and the logic NAND gate 2311 receives the pre-alert signal ALERT_Pre and the first delayed signal CRC_0 subjected to a logical NOT operation, and outputs the alert signal ALERT_n.

In some embodiments, an interval between two adjacent pulses of the second delayed signal CRC_1 is T clock cycles, an interval between the second delayed signal CRC_1 and the third delayed signal CRC_RST is (M−1) clock cycles, T is an integer greater than or equal to 1 and less than or equal to 12, and M is an integer greater than or equal to (T+1). It may be understood that the interval between two adjacent pulses of the second delayed signal CRC_1 is less than the interval between the second delayed signal CRC_1 and the third delayed signal CRC_RST. Therefore, the second delay unit 222 has not output an $(N-1)^{th}$ pulse, corresponding to $C_{N-1}$, of the third delayed signal CRC_RST to the latch unit 232 each time an $N^{th}$ pulse $C_N$ of the second delayed signal CRC_1 transitions from the first signal value to the second signal value. A reset operation is performed on the M flip-flops in the second delay unit 222 based on the CRC signal CRC ERR each time the $N^{th}$ pulse $C_N$ of the second delayed signal CRC_1 transitions from the first signal value to the second signal value, to eliminate the $(N-1)^{th}$ pulse, corresponding to the $(N-1)^{th}$ pulse $C_{N-1}$ of the second delayed signal CRC_1, of the third delayed signal CRC_RST. As such, finally, all the first (N−1) pulses of the third delay signal CRC_RST are reset, and the third delayed signal CRC_RST has only an $N^{th}$ pulse corresponding to $C_N$.

It may be understood that the second delayed signal CRC_1 is received by the set port S of the latch unit 232, and the third delayed signal CRC_RST is received by the reset port R. All the first (N−1) pulses of the third delayed signal CRC_RST received by the reset port R have the first signal value, namely, a low logic level, and a high logic level is received by the reset port R after the $N^{th}$ pulse of the third delayed signal CRC_RST transitions from the first signal value to the second signal value.

In some embodiments, when the $(N-1)^{th}$ pulse of the second delayed signal CRC_1 transitions from the first signal value to the second signal value, the third delayed signal CRC_RST has the first signal value, and the pre-alert signal ALERT_Pre output by the SR latch to the logic NAND gate has the second signal value. In this case, the first delayed signal CRC_0 has the first signal value, the second signal value is output by the inverter 2312 to the logic NAND gate 2311 after a logical NOT operation is performed by the inverter 2312 on the first delayed signal CRC_0, and the alert signal ALERT_n output by the logic NAND gate 2311 transitions from the second signal value to the first signal value.

After (T−1) clock cycles, that is, clock cycles between the $(N-1)^{th}$ pulse of the second delayed signal CRC_1 and an $N^{th}$ pulse of the first delayed signal CRC_0, the third delayed signal CRC RST has the first signal value, the second delayed signal CRC_1 has the first signal value, and the SR latch maintains a previous value of the output port Q. In this case, the pre-alert signal ALERT_Pre output by the SR latch to the logic NAND gate 2311 has the second signal value. In this case, the $N^{th}$ pulse of the first delayed signal CRC_0 transitions from the first signal value to the second signal value, the first signal value is output by the inverter 2312 to the logic NAND gate 2311 after a logical NOT operation is performed by the inverter 2312 on the first delayed signal CRC_0, and the alert signal ALERT_n output by the logic NAND gate 2311 transitions from the first signal value to the second signal value, in other words, an $(N-1)^{th}$ pulse, with a pulse width of (T−1) clock cycles, of the alert signal ALERT_n is generated.

After one more clock cycle, the third delayed signal CRC_RST has the first signal value, and the $N^{th}$ pulse of the second delayed signal CRC_1 transitions from the first signal value to the second signal value. In this case, the pre-alert signal ALERT_Pre output by the SR latch to the logic NAND gate 2311 has the second signal value. In this case, the first delayed signal CRC_0 has the first signal value, the second signal value is output by the inverter 2312 to the logic NAND gate 2311 after a logical NOT operation is performed by the inverter 2312 on the first delayed signal CRC_0, and the alert signal ALERT_n output by the logic NAND gate 2311 transitions from the second signal value to the first signal value.

After (M−1) clock cycles, the $N^{th}$ pulse of the third delayed signal CRC_RST transitions from the first signal value to the second signal value, and the second delayed signal CRC_1 has the first signal value. In this case, the pre-alert signal ALERT_Pre output by the SR latch to the logic NAND gate 2311 has the first signal value. In this case, the first delayed signal CRC_0 has the first signal value, the second signal value is output by the inverter 2312 to the logic NAND gate 2311 after a logical NOT operation is performed by the inverter 2312 on the first delayed signal CRC_0, and the alert signal ALERT_n output by the logic NAND gate 2311 transitions from the first signal value to the second signal value, in other words, an $N^{th}$ pulse, with a pulse width of (M−1) clock cycles, of the alert signal ALERT_n is generated.

In some embodiments, the width of each of the first pulse to the $(N-1)^{th}$ pulse of the alert signal ALERT_n is (T−1) clock cycles, and the width of the $N^{th}$ pulse of the alert signal is (M−1) clock cycles.

Figure 4:
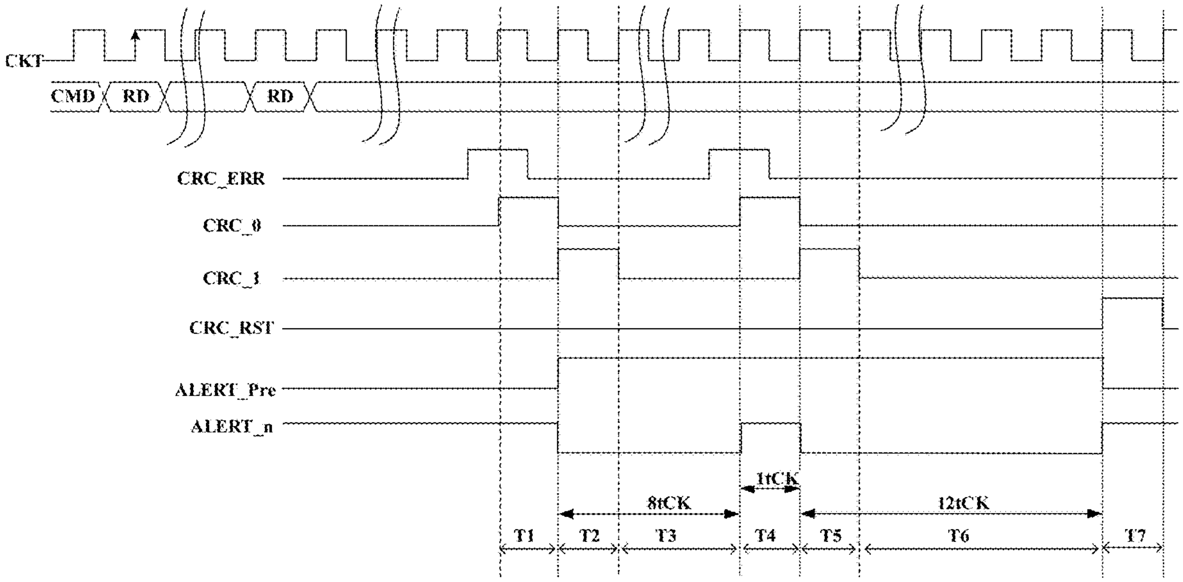
FIG. 4 is a timing diagram of generating an alert signal by a cyclic redundancy check (CRC) circuit according to an embodiment of the present disclosure.
Figures 5, 6:
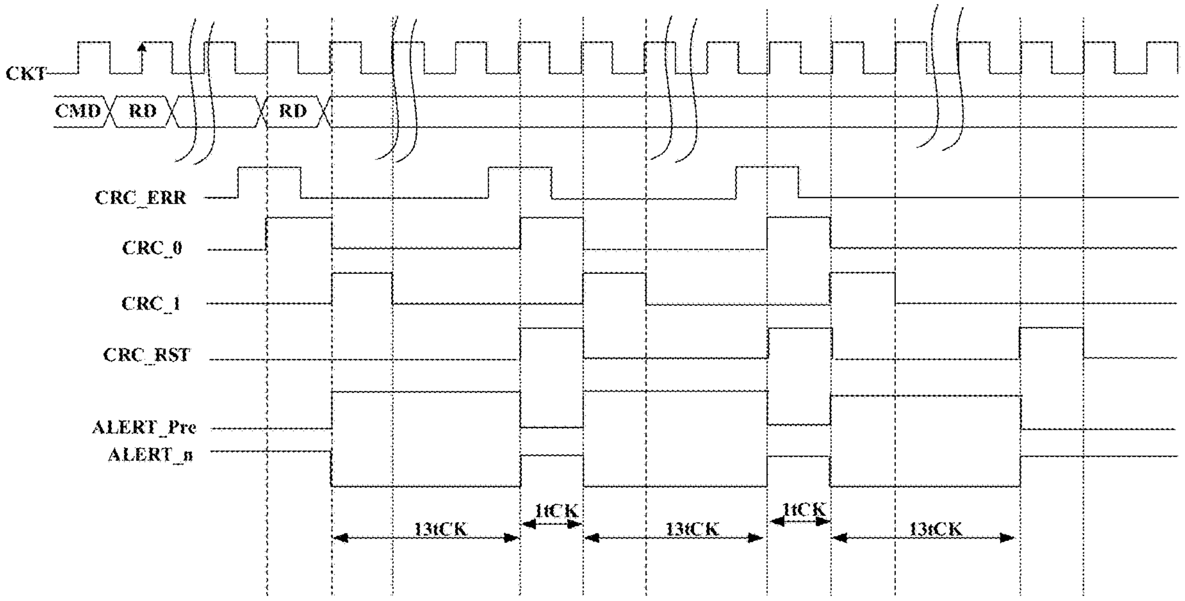
FIG. 5 shows logic level values of signals in a cyclic redundancy check (CRC) circuit in different phases according to an embodiment of the present disclosure.
FIG. 6 is a timing diagram of generating an alert signal by another cyclic redundancy check (CRC) circuit according to an embodiment of the present disclosure.

In a specific implementation, the process in which the alert signal is generated by the cyclic redundancy check (CRC) circuit is described with an example in which N is equal to 2, T is equal to 9, and M is equal to 13. FIG. 4 is a timing diagram of generating an alert signal by a cyclic redundancy check (CRC) circuit according to an embodiment of the present disclosure. FIG. 5 shows logic level values of signals in the cyclic redundancy check (CRC) circuit in FIG. 4 in different phases. Reference is made to FIG. 2 to FIG. 5. Specifically, CRC errors are detected by the detection module 210 in data transmission processes of two consecutive read operations. Therefore, a CRC signal CRC_ERR generated by the detection module 210 in response to the CRC errors has two pulses, and an interval between two adjacent pulses is nine clock cycles. The second delay unit 222 of the delay module 220 includes 13-stage flip-flops. Therefore, an interval between a second delayed signal CRC_1 and a first delayed signal CRC_0 is one clock cycle, and an interval between a third delayed signal CRC_RST and the first delayed signal CRC_0 is 13 clock cycles. The second delayed signal CRC_1 is received by the set port S of the SR latch of the latch unit 232, the third delayed signal CRC_RST is received by the reset port R of the SR latch, and a pre-alert signal ALERT_Pre is output by the output port Q of the SR latch.

It should be noted that the quantity of M-stage flip-flops in the second delay unit herein is merely an example. In another embodiment, the quantity of M-stage flip-flops in the second delay unit may be set as required.

In a T1 phase, the third delayed signal CRC_RST is at logic 0, and the second delayed signal CRC_1 is at logic 0. Therefore, both a reset signal and a set signal that are received by the SR latch are at logic 0, and the SR latch maintains an value of the output port Q existing before the T1 phase. In this case, the pre-alert signal ALERT_Pre output by the SR latch to the logic NAND gate 2311 is at logic 0. In this case, the first pulse of the initial CRC signal CRC_0 transitions from logic 0 to logic 1, logic 0 is output by the inverter 2312 to the logic NAND gate 2311 after a logical NOT operation is performed by the inverter 2312 on the first delayed signal CRC_0, and an alert signal ALERT_n output by the logic NAND gate 2311 is at logic 1.

In a T2 phase, the third delayed signal CRC_RST is at logic 0, and the first pulse of the second delayed signal CRC_1 transitions from logic 0 to logic 1. In this case, the pre-alert signal ALERT_Pre output by the SR latch to the logic NAND gate 2311 is at logic 1. In this case, the first delayed signal CRC_0 transitions from logic 1 to logic 0, logic 1 is output by the inverter 2312 to the logic NAND gate 2311 after a logical NOT operation is performed by the inverter 2312 on the first delayed signal CRC_0, and the alert signal ALERT_n output by the logic NAND gate 2311 is at logic 0.

In a T3 phase, the third delayed signal CRC_RST is at logic 0, the second delayed signal CRC_1 transitions from logic 1 to logic 0, and the SR latch maintains an value of the output port Q existing before the T3 phase. In this case, the pre-alert signal ALERT_Pre output by the SR latch to the logic NAND gate 2311 is at logic 1. In this case, the first delayed signal CRC_0 is at logic 0, logic 1 is output by the inverter 2312 to the logic NAND gate 2311 after a logical NOT operation is performed by the inverter 2312 on the first delayed signal CRC_0, and the alert signal ALERT_n output by the logic NAND gate 2311 is at logic 0.

After a total of eight clock cycles in the T2 phase and the T3 phase, that is, clock cycles between the first pulse of the second delayed signal CRC_1 and the second pulse of the first delayed signal CRC_0, in a T4 phase, the third delayed signal CRC_RST is at logic 0, the second delayed signal CRC_1 is at logic 0, and the SR latch maintains the value of the output port Q existing before the T4 phase. In this case, the pre-alert signal ALERT_Pre output by the SR latch to the logic NAND gate 2311 is at logic 1. In this case, the second pulse of the first delayed signal CRC_0 transitions from logic 0 to logic 1, logic 0 is output by the inverter 2312 to the logic NAND gate 2311 after a logical NOT operation is performed by the inverter 2312 on the first delayed signal CRC_0, and the alert signal ALERT_n output by the logic NAND gate 2311 is at logic 1, in other words, the first pulse, with a pulse width of eight clock cycles, of the alert signal ALERT_n is generated.

After one more clock cycle, in a T5 phase, the third delayed signal CRC_RST is at logic 0, and the second pulse of the second delayed signal CRC_1 transitions from logic 0 to logic 1. In this case, the pre-alert signal ALERT_Pre output by the SR latch to the logic NAND gate 2311 is at logic 1. In this case, the first delayed signal CRC_0 is at logic 0, logic 1 is output by the inverter 2312 to the logic NAND gate 2311 after a logical NOT operation is performed by the inverter 2312 on the first delayed signal CRC_0, and the alert signal ALERT_n output by the logic NAND gate 2311 is at logic 0.

In a T6 phase, the third delayed signal CRC_RST is at logic 0, the second delayed signal CRC_1 is at logic 0, and the SR latch maintains the value of the output port Q existing before the T6 phase. In this case, the pre-alert signal ALERT_Pre output by the SR latch to the logic NAND gate 2311 is at logic 1. In this case, the first delayed signal CRC_0 is at logic 0, logic 1 is output by the inverter 2312 to the logic NAND gate 2311 after a logical NOT operation is performed by the inverter 2312 on the first delayed signal CRC_0, and the alert signal ALERT_n output by the logic NAND gate 2311 is at logic 0.

After a total of 12 clock cycles in the T5 phase and the T6 phase, that is, clock cycles between the second pulse of the second delayed signal CRC_1 and the first pulse of the third delayed signal CRC_RST, in a T7 phase, the third delayed signal CRC_RST transitions from logic 0 to logic 1, and the second delayed signal CRC_1 is at logic 0. In this case, the pre-alert signal ALERT_Pre output by the SR latch to the logic NAND gate 2311 is at logic 0. In this case, the first delayed signal CRC_0 is at logic 0, logic 1 is output by the inverter 2312 to the logic NAND gate 2311 after a logical NOT operation is performed by the inverter 2312 on the first delayed signal CRC_0, and the alert signal ALERT_n output by the logic NAND gate 2311 is at logic 1, in other words, the second pulse, with a pulse width of 12 clock cycles, of the alert signal ALERT_n is generated.

As such, the alert signal ALERT_n output by the cyclic redundancy check (CRC) circuit has two pulses corresponding to the two CRC errors, the width of the first pulse formed by the T2 phase and the T3 phase is eight clock cycles, and the width of the second pulse formed by the T5 phase and the T6 phase is 12 clock cycles. In the T4 phase, the two pulses of the alert signal ALERT_n are distinguished from each other by a high logic level of the alert signal ALERT_n, to avoid the following case: The two pulses cannot correspond to the two CRC errors in the data transmission processes when the two pulses overlap each other. As such, the two CRC errors can be identified with the alert signal ALERT_n, so that the reliability of the data transmission processes is improved.

According to the memory device provided in the embodiments of the present disclosure, when N CRC errors are detected by the detection module, an interval between two adjacent pulses of the CRC signal CRC_ERR which is a response to the N CRC errors is T clock cycles, the second delay unit includes the M flip-flops, T is an integer greater than or equal to 1 and less than or equal to 12, and M is an integer greater than or equal to (T+1), the alert signal ALERT_n has N pulses corresponding to the CRC errors, and the alert signal ALERT_n includes at least one pulse with the width of the second preset time interval.

According to the memory device provided in the embodiments of the present disclosure, when N CRC errors are detected by the detection module, an interval between two adjacent pulses of the CRC signal CRC_ERR is T clock cycles, T is an integer greater than 12, and M is an integer less than (T+1), the alert signal ALERT_n has N pulse, and the width of each of the N pulses is (M−1) clock cycles.

The interval between two adjacent pulses of the second delayed signal CRC_1 is greater than the interval between the second delayed signal CRC_1 and the third delayed signal CRC_RST. Therefore, the second delay unit 222 has output the $(N-1)^{th}$ pulse, corresponding to $C_{N-1}$, of the third delayed signal CRC_RST to the latch unit when the $N^{th}$ pulse of the second delayed signal transitions from the first signal value to the second signal value.

In a specific implementation, the process in which the alert signal is generated by the cyclic redundancy check (CRC) circuit is described with an example in which N is equal to 3, T is equal to 14, and M is equal to 14. FIG. 6 is a timing diagram of generating an alert signal by another cyclic redundancy check (CRC) circuit according to an embodiment of the present disclosure. Specifically, CRC errors are detected by the detection module 210 in data transmission processes of three consecutive read operations. Therefore, a CRC signal CRC_ERR generated by the detection module 210 in response to the CRC errors has three pulses, and an interval between every two adjacent pulses is 15 clock cycles. The second delay unit 222 of the delay module 220 includes 14-stage flip-flops. Therefore, an interval between a second delayed signal CRC_1 and a first delayed signal CRC_0 is one clock cycle, an interval between a third delayed signal CRC RST and the first delayed signal CRC_0 is 14 clock cycles, and an interval between the second delayed signal CRC_1 and the third delayed signal CRC_RST is 13 clock cycles.

The second delayed signal CRC_1 is received by the set port S of the SR latch of the latch unit 232, the third delayed signal CRC_RST is received by the reset port R of the SR latch, and a pre-alert signal ALERT_Pre is output by the output port Q of the SR latch.

The pre-alert signal ALERT_Pre output by the SR latch to the logic NAND gate 2311 is at logic 1 when the third delayed signal CRC_RST is at logic 0 and the first pulse of the second delayed signal CRC_1 transitions from logic 0 to logic 1. In this case, the first delayed signal CRC_0 is at logic 0, logic 1 is output by the inverter 2312 to the logic NAND gate 2311 after a logical NOT operation is performed by the inverter 2312 on the first delayed signal CRC_0, and an alert signal ALERT_n output by the logic NAND gate 2311 is at logic 0.

After 13 clock cycles, the first pulse of the third delayed signal CRC_RST transitions from logic 0 to logic 1, the second delayed signal CRC_1 is at logic 0, and the pre-alert signal ALERT_Pre output by the SR latch to the logic NAND gate 2311 is at logic 0. In this case, the first delayed signal CRC_0 is at logic 0, logic 1 is output by the inverter 2312 to the logic NAND gate 2311 after a logical NOT operation is performed by the inverter 2312 on the first delayed signal CRC_0, and the alert signal ALERT_n output by the logic NAND gate 2311 is at logic 1, in other words, the first pulse, with a pulse width of 13 clock cycles, of the alert signal ALERT_n is generated.

Processes of generating the second pulse and the third pulse of the alert signal ALERT_n are similar to the process of generating the first pulse, and details are not described herein again.

In this embodiment of the present disclosure, the alert signal ALERT_n is output after a logical operation is performed by the logical operation unit on the pre-alert signal ALERT_Pre and the first delayed signal CRC_0. When N is equal to 3, T is equal to 14, and M is equal to 14, referring to FIG. 6, the alert signal ALERT_n output by the cyclic redundancy check (CRC) circuit has three pulses corresponding to the three CRC errors, and the width of each of the first pulse to the third pulse is 13 clock cycles.

Figure 7:
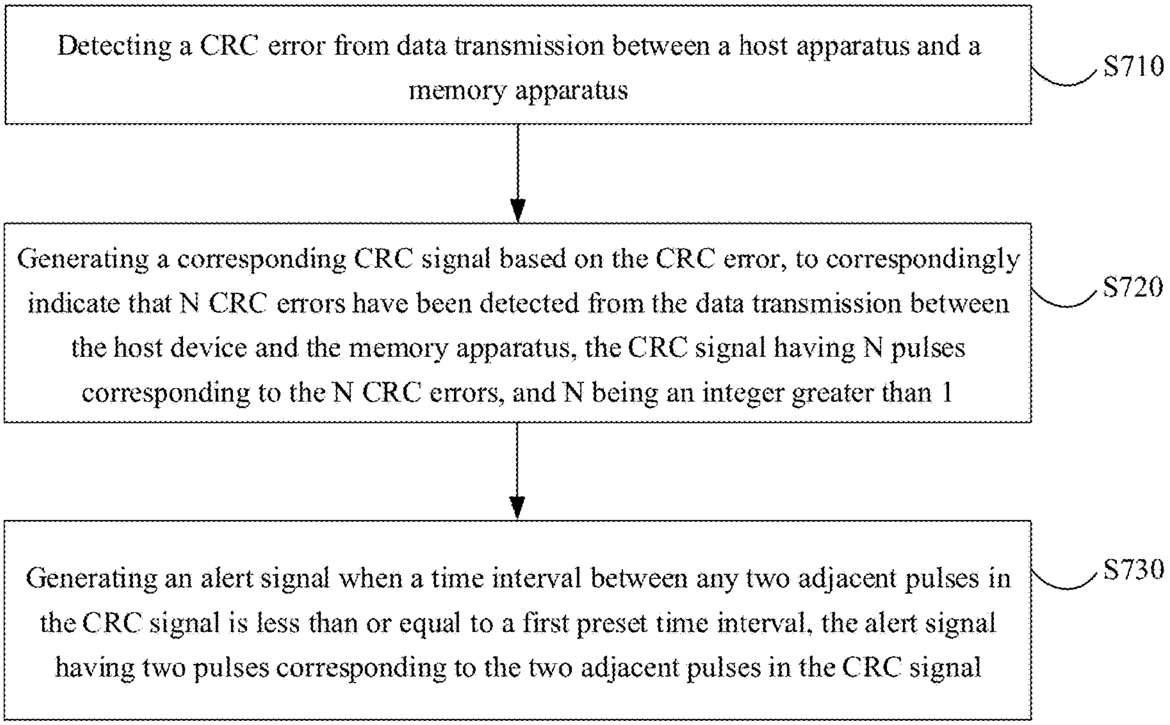
FIG. 7 is a schematic flowchart of a specific implementation of a control method for a memory device according to an embodiment of the present disclosure.

An embodiment of the present disclosure further provides a control method for a memory device. FIG. 7 is a schematic flowchart of a specific implementation of a control method for a memory device according to an embodiment of the present disclosure. As shown in FIG. 7, the control method specifically includes the steps as follows:

In the step of S710, a CRC error is detected from data transmission between a host device and the memory device.

In the step of S720, a corresponding CRC signal is generated based on the CRC error, to correspondingly indicate that N CRC errors have been detected from the data transmission between the host device and the memory device. The CRC signal has N pulses corresponding to the N CRC errors, and N is an integer greater than 1.

In the step of S730, an alert signal is generated when a time interval between any two adjacent pulses in the CRC signal is less than or equal to a first preset time interval. The alert signal has two pulses corresponding to the two adjacent pulses in the CRC signal.

In this embodiment of the present disclosure, a delay operation is performed by a first delay unit on the CRC signal to generate a first delayed signal CRC_0, and a delay operation is performed by a second delay unit on the first delayed signal CRC_0 to generate a second delayed signal CRC_1 and a third delayed signal CRC_RST. The third delayed signal CRC_RST is delayed by a second preset time interval relative to the second delayed signal CRC_1.

The alert signal is generated by an alert signal generation unit based on the first delayed signal CRC_0, the second delayed signal CRC_1, and the third delayed signal CRC_RST. The alert signal ALERT_n includes at least one pulse with the width of the second preset time interval.

In some embodiments, the second delayed signal CRC_1 is delayed by at least one clock cycle relative to the first delayed signal CRC_0, and the third delayed signal CRC_RST is delayed by M clock cycles relative to the first delayed signal CRC_0. The third delayed signal CRC_RST is delayed by (M−1) clock cycles, namely, the length of the second preset time interval, relative to the second delayed signal CRC_1.

In some embodiments, M is an integer greater than or equal to (T+1).

In some embodiments, the length of the second preset time interval is greater than or equal to T clock cycles.

In this embodiment of the present disclosure, the first preset time interval is T clock cycles, and T is an integer greater than or equal to 1 and less than or equal to 12. An interval between two adjacent pulses of the CRC signal CRC_ERR is the first preset time interval. A reset operation is performed on the second delay unit 222 based on the CRC signal CRC_ERR each time an $N^{th}$ pulse of the second delayed signal CRC_1 transitions from a first signal value to a second signal value. The first signal value is at a low logic level, and the second signal value is at a high logic level.

Figure 8:
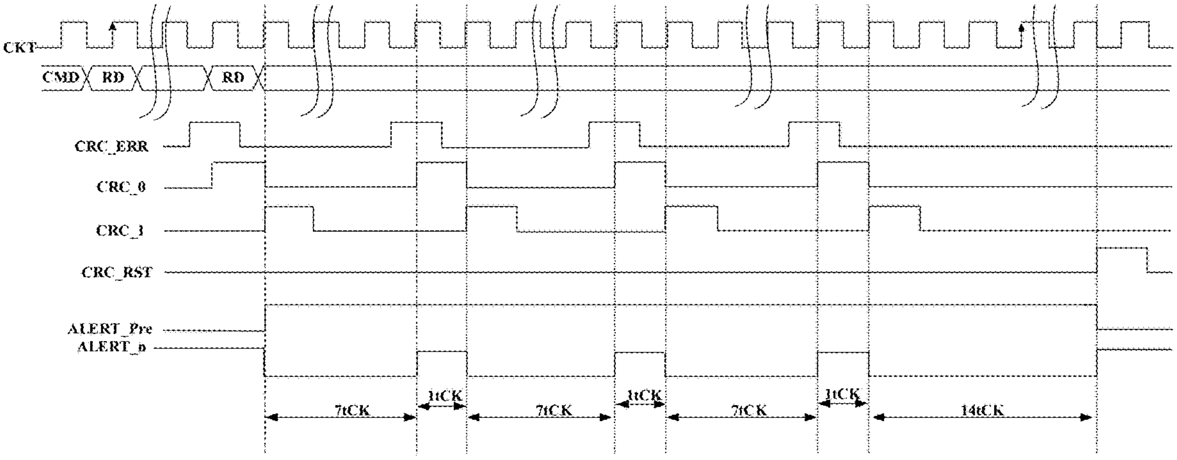
FIG. 8 is a timing diagram of generating an alert signal by still another cyclic redundancy check (CRC) circuit according to an embodiment of the present disclosure.

In a specific implementation, a process in which an alert signal is generated by a cyclic redundancy check (CRC) circuit is described with an example in which N is equal to 4, T is equal to 8, and M is equal to 15. FIG. 8 is a timing diagram of generating an alert signal by still another cyclic redundancy check (CRC) circuit according to an embodiment of the present disclosure. Specifically, CRC errors are detected by a detection module 210 in data transmission processes of four consecutive read operations. Therefore, a CRC signal CRC_ERR generated by the detection module 210 in response to the CRC errors has four pulses, and an interval between every two adjacent pulses is eight clock cycles. A second delay unit 222 of a delay module 220 includes 15-stage flip-flops. Therefore, an interval between a second delayed signal CRC_1 and a first delayed signal CRC_0 is one clock cycle, and an interval between a third delayed signal CRC_RST and the first delayed signal CRC_0 is 15 clock cycles. The second delayed signal CRC_1 is received by a set port S of an SR latch of a latch unit 232, the third delayed signal CRC_RST is received by a reset port R of the SR latch, and a pre-alert signal ALERT_Pre is output by an output port Q of the SR latch.

In this embodiment of the present disclosure, an alert signal ALERT_n is output after a logical operation is performed by a logical operation unit on the pre-alert signal ALERT_Pre and the first delayed signal CRC_0, the width of each of the first pulse to an $(N-1)^{th}$ pulse of the alert signal ALERT_n is (T−1) clock cycles, and the width of an $N^{th}$ pulse of the alert signal ALERT_n is (M−1) clock cycles. Specifically, when N is equal to 4, T is equal to 8, and M is equal to 15, referring to FIG. 8, the alert signal ALERT_n output by the cyclic redundancy check (CRC) circuit has four pulses corresponding to the four CRC errors, the width of each of the first pulse to the third pulse is seven clock cycles, and the width of the fourth pulse is 14 clock cycles. As such, the reliability of the data transmission processes is improved because the following case is avoided: The four pulses cannot correspond to the four CRC errors in the data transmission processes when the four pulses overlap each other.

In the technical solutions provided in the embodiments of the present disclosure, a cyclic redundancy check (CRC) circuit in a memory device is redesigned, and a cyclic redundancy check (CRC) circuit is provided. The cyclic redundancy check (CRC) circuit is provided with a detection module, configured to generate a CRC signal to correspondingly indicate that N CRC errors have been detected from data transmission between a host device and the memory device, where the CRC signal has N pulses corresponding to the N CRC errors, and N is an integer greater than 1; and an alert signal generation module, configured to generate an alert signal when a time interval between any two adjacent pulses in the CRC signal is less than or equal to a first preset time interval, where the alert signal has two pulses corresponding to the two adjacent pulses in the CRC signal. As such, during error detection performed by the cyclic redundancy check (CRC) circuit in the memory device provided in the present disclosure, when N CRC errors occurring in a data transmission process are detected, an alert signal having N pulses corresponding to the N CRC errors can be generated, and the CRC errors can be identified with the alert signal, so that the reliability of the data transmission process is improved.

It should be understood that "an embodiment" or "some embodiments" mentioned throughout the specification means that specific features, structures, or characteristics related to the embodiments are included in at least one embodiment of the present disclosure. Therefore, "in an embodiment" or "in some embodiments" occurring throughout the specification does not necessarily refer to the same embodiment. In addition, these specific features, structures, or characteristics may be combined in one or more embodiments in any appropriate manner. It should be understood that in various embodiments of the present disclosure, sequence numbers of the foregoing processes do not mean an execution sequence. The execution sequence of the processes should be determined based on functions and internal logic of the processes, and should not constitute any limitation on an implementation process of the embodiments of the present disclosure. The sequence numbers of the foregoing embodiments of the present disclosure are merely for the purpose of description, and do not represent priorities of the embodiments.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure.

Industrial Applicability

In the technical solutions provided in the embodiments of the present disclosure, a cyclic redundancy check (CRC) circuit in a memory device is redesigned, and a cyclic redundancy check (CRC) circuit is provided. The cyclic redundancy check (CRC) circuit is provided with a detection module, configured to generate a CRC signal to correspondingly indicate that N CRC errors have been detected from data transmission between a host device and the memory device, where the CRC signal has N pulses corresponding to the N CRC errors, and Nis an integer greater than 1; and an alert signal generation module, configured to generate an alert signal when a time interval between any two adjacent pulses in the CRC signal is less than or equal to a first preset time interval, where the alert signal has two pulses corresponding to the two adjacent pulses in the CRC signal. As such, during error detection performed by the cyclic redundancy check (CRC) circuit in the memory device provided in the present disclosure, when N CRC errors occurring in a data transmission process are detected, an alert signal having N pulses corresponding to the N CRC errors can be generated, and the CRC errors can be identified with the alert signal, so that the reliability of the data transmission process is improved.

What is claimed is:

1. A memory device, comprising:

a cyclic redundancy check (CRC) circuit, configured to indicate whether a CRC error has been detected from data transmission between a host device and the memory device, the cyclic redundancy check (CRC) circuit comprising:

a detection module, configured to generate a CRC signal to correspondingly indicate that N CRC errors have been detected in the data transmission between the host device and the memory device, the CRC signal having N pulses corresponding to the N CRC errors, and N being an integer greater than 1; and an alert signal generation module, configured to generate an alert signal when a time interval between any two adjacent pulses in the CRC signal is less than or equal to a first preset time interval, the alert signal having two pulses corresponding to the two adjacent pulses in the CRC signal;

wherein when N CRC errors have been detected in the data transmission between the host device and the memory device, the alert signal comprises N pulses corresponding to the N CRC errors, each pulse indicating one CRC error.

2. The memory device according to claim 1, wherein the alert signal generation module comprises a first delay unit, a second delay unit, and an alert signal generation unit, the first delay unit being configured to perform a delay operation on the CRC signal, and generate a first delayed signal;

the second delay unit being configured to perform a delay operation on the first delayed signal, and generate a second delayed signal and a third delayed signal, the third delayed signal being delayed by a second preset time interval relative to the second delayed signal; and the alert signal generation unit being configured to generate the alert signal based on the first delayed signal, the second delayed signal, and the third delayed signal, the alert signal comprising at least one pulse with a width of the second preset time interval.

3. The memory device according to claim 2, wherein the second delay unit is a shift register, a length value of the shift register is M, and M is an integer greater than or equal to (T+1).

4. The memory device according to claim 3, wherein the shift register comprises:

M-stage flip-flops, clock terminals of M flip-flops constituting the M-stage flip-flops receiving a same clock signal, an output port Q of each current-stage flip-flop in the M-stage flip-flops being connected to an input port D of a next-stage flip-flop, an input port D of a first-stage flip-flop receiving the first delayed signal, an output port Q of the first-stage flip-flop being connected to a first input terminal of the alert signal generation unit, and outputting the second delayed signal delayed by one clock cycle to the alert signal generation unit; and an output port Q of an $M^{th}$-stage flip-flop being connected to a second input terminal of the alert signal generation unit, and outputting the third delayed signal delayed by M clock cycles to the alert signal generation unit.

5. The memory device according to claim 4, wherein the CRC signal serves as a reset signal for the M flip-flops of the shift register.

6. The memory device according to claim 5, wherein the alert signal generation unit comprises a latch unit and a logical operation unit, the latch unit being configured to receive the second delayed signal and the third delayed signal, and output a pre-alert signal; and the logical operation unit being configured to receive the pre-alert signal and the first delayed signal, and output the alert signal.

7. The memory device according to claim 6, wherein the latch unit comprises an SR latch, and a set port of the SR latch serves as the first input terminal of the alert signal generation unit, and is connected to the output port Q of the first-stage flip-flop; and a reset port of the SR latch serves as the second input terminal of the alert signal generation unit, and is connected to the output port Q of the $M^{th}$-stage flip-flop, and an output terminal of the SR latch is connected to an input terminal of the logical operation unit.

8. The memory device according to claim 7, wherein the logical operation unit comprises an inverter and a logic NAND gate, and an input terminal of the inverter is connected to an output port of the first delay unit, and is configured to receive the first delayed signal; and output terminals of the SR latch and the inverter are connected to an input terminal of the logic NAND gate, and the logic NAND gate receives the pre-alert signal and the first delayed signal subjected to a logical NOT operation, and outputs the alert signal.

9. The memory device according to claim 2, wherein the second delayed signal is delayed by at least one clock cycle relative to the first delayed signal.

10. The memory device according to claim 9, wherein the first preset time interval is T clock cycles, and T is an integer greater than or equal to 1 and less than or equal to 12.

11. The memory device according to claim 10, wherein a length of the second preset time interval is greater than or equal to T clock cycles.

12. The memory device according to claim 11, wherein a sum of a delay applied by the first delay unit to the CRC signal and one clock cycle is less than 13 ns.

13. The memory device of claim 1, wherein a pulse width of a first one of the two pulses of the alert signal is less than or equal to a pulse width of a second one of the two pulses of the alert signal.

14. A control method for a memory device, comprising:
detecting a CRC error from data transmission between a host device and the memory device;
generating a corresponding CRC signal based on the CRC error, to correspondingly indicate that N CRC errors have been detected in the data transmission between the host device and the memory device, the CRC signal having N pulses corresponding to the N CRC errors, and N being an integer greater than 1; and
generating an alert signal when a time interval between any two adjacent pulses in the CRC signal is less than or equal to a first preset time interval, the alert signal having two pulses corresponding to the two adjacent pulses in the CRC signal;
wherein when N CRC errors have been detected from the data transmission between the host device and the memory device, the alert signal comprises N pulses corresponding to the N CRC errors, each pulse indicating one CRC error.

15. The control method according to claim 14, wherein the method further comprises:
performing a delay operation on the CRC signal, and generating a first delayed signal;
performing a delay operation on the first delayed signal, and generating a second delayed signal and a third delayed signal, the third delayed signal being delayed by a second preset time interval relative to the second delayed signal; and
generating the alert signal based on the first delayed signal, the second delayed signal, and the third delayed signal, the alert signal comprising at least one pulse with a width of the second preset time interval.

16. The control method according to claim 15, wherein the second delayed signal is delayed by at least one clock cycle relative to the first delayed signal.

17. The control method according to claim 16, wherein the first preset time interval is T clock cycles, and T is an integer greater than or equal to 1 and less than or equal to 12.

18. The control method according to claim 17, wherein a length of the second preset time interval is greater than or equal to T clock cycles.

19. The control method according to claim 16, wherein the third delayed signal is delayed by M clock cycles relative to the first delayed signal, and M is an integer greater than or equal to (T+1).

20. The memory device of claim 13, wherein when a time interval between only two adjacent pulses in the CRC signal is less than or equal to the first preset time interval, a pulse width of a first one of the two pulses of the alert signal is less than a pulse width of a second one of the two pulses of the alert signal.

* * * * *